United States Patent [19]

Yoshizawa et al.

[11] 4,247,911
[45] Jan. 27, 1981

[54] DRIVE CIRCUIT FOR MAGNETIC BUBBLE DEVICE

[75] Inventors: Shigeru Yoshizawa, Tokorozawa; Hirokazu Aoki, Hachioji; Shinsaku Chiba; Koichi Mayama, both of Mobara; Takashi Toyooka, Kokubunji; Nobuo Saito, Mitaka, all of Japan

[73] Assignee: Hitachi, Ltd., Japan

[21] Appl. No.: 29,056

[22] Filed: Apr. 11, 1979

[30] Foreign Application Priority Data

Apr. 12, 1978 [JP] Japan .................................. 53-42312

[51] Int. Cl.² .............................................. G11C 19/08
[52] U.S. Cl. ........................................................ 365/6
[58] Field of Search ............................................ 365/6

[56] References Cited

U.S. PATENT DOCUMENTS 3,952,292  4/1976  Kamatsu et al. .......................... 365/6

OTHER PUBLICATIONS

IEEE Transactions on Magnetics–vol. Mag-11, No. 1, Jan. 1975, pp. 16–20.

*Primary Examiner*—James W. Moffitt
*Attorney, Agent, or Firm*—Craig & Antonelli

[57] ABSTRACT

The present invention provides an improved method and apparatus for driving a magnetic bubble device, in which a d-c voltage supply and drive coils are connected to a bridge circuit consisting of four bi-directional switches, and alternating currents with steps (such as currents consisting of triangular waves or trapezoidal waves) are produced in the drive coils by suitably controlling the turn on or off of the bi-directional switches. As a result, the d-c level in the alternating current is not shifted by the variation in width of pulses which control the opening and closing of the bi-directional switches, and the magnetic bubble device is provided with a greatly improved operation margin.

13 Claims, 57 Drawing Figures

FIG. 1 Prior Art

FIG. 2A Prior Art INPUT SIGNAL 1

FIG. 2B Prior Art INPUT SIGNAL 2

DRIVE CIRCUIT FOR MAGNETIC BUBBLE DEVICE

BACKGROUND OF THE INVENTION

1. Field of the Invention

The present invention deals with an improved drive circuit for driving a magnetic bubble device such as magnetic bubble memory.

2. Description of the Prior Art

A well-known method of driving magnetic bubbles is, generally, based on the use of a rotating magnetic field and a permalloy pattern. According to this method, a T-bar shaped permalloy pattern, for example, is formed on the surface of a crystal which allows the existence of magnetic bubbles by way of metal vaporization or etching, and a rotating magnetic field is applied from an external unit. The rotating magnetic field can usually be obtained by flowing electric currents having phases different by 90° from each other to a coil X and a coil Y that are disposed in a crossing manner. The magnetic bubbles are propagated along the permalloy pattern in accordance with the rotating magnetic field. The circuits for driving such a magnetic bubble device by means of a rotating magnetic field can be roughly grouped into a sine wave drive circuit and a triangular wave drive circuit (U.S. Pat. No. 3,952,292) featuring various respective merits and demerits. For instance, the triangular wave drive circuit has the advantages that it does not require a resonant capacitor such as is needed by the sine wave drive circuit, and that it does not require resonant adjustment. The triangular wave drive circuit, however, has certain disadvantages in that it consumes increased electric power during high frequency operations as compared with the sine wave drive circuit and that it is virtually not usable at rotating magnetic field frequencies of higher than 200 KHz. Because of these reasons, the triangular wave drive circuit is used for small-size and small-capacity magnetic bubble memories where the circuit is used in the form of a one-chip package and at low speeds to feature its advantages.

In the conventional triangular wave drive circuit, however, unless the time for rendering the control switches conductive to cause currents to flow which increase toward the positive direction to the drive coils X and Y, is set to be strictly equal to the time for rendering the control switches to cause currents to flow which increase toward the negative direction, the d-c level of the drive current is shifted toward either the positive direction or the negative direction. This means that a direct current is added to the triangular drive current, causing the vector of the rotating magnetic field to undergo parallel translation toward a given direction, presenting a serious problem in the operation of magnetic bubbles.

SUMMARY OF THE INVENTION

One object of the present invention, therefore, is to provide a novel circuit for driving a magnetic bubble device which eliminates the level shift in the drive current inherent in the aforementioned earlier drive circuits.

In order to attain this and other objects, a drive circuit for a magnetic bubble device according to the present invention is provided including a parallel circuit with a first serial circuit made up of a first bi-directional switch and a second bi-directional switch, and a second serial circuit made up of a third bi-directional switch and a fourth bi-directional switch. A direct-current voltage source is connected across the two terminals of said parallel circuit, and drive coils are connected between a connection point of the first and second bi-directional switches of said first serial circuit and a connection point of the third and fourth bi-directional switches of said second serial circuit. In addition, a switch control circuit is provided for controlling the opening and closing operation of said first to fourth bi-directional switches to produce an alternating current flow into said drive coils. This switch control circuit controls the opening and closing operation of said first to fourth bi-directional switches in such a manner that the waveform of said alternating current possesses a time region in which the time-differentiated value of said waveform becomes zero when the current heading from the positive polarity to the negative polarity or heading from the negative polarity to the positive polarity crosses a value of zero on the time axis.

According to the above-mentioned characteristic setup of the present invention, the level shift in the drive current flowing into the drive coils can be completely eliminated, so that the vector of the rotating magnetic field rotates describing a predetermined locus with respect to the center of rotation without being caused to undergo parallel translation in a given direction. As a result, the magnetic bubble device can be stably operated with an increased margin of operation.

Other objects, features, functions and effects of the present invention will become apparent from the below-mentioned detailed description of the embodiments.

DESCRIPTION OF THE PREFERRED EMBODIMENTS

The above-mentioned defect of the conventional triangular wave drive circuit, i.e., the cause of a change in the level of the output current by the duty ratio of input pulses, stems from the accumulation of slight deviations in the duty ratio in each of the cycles. In the triangular wave drive circuit, the inclination of current flowing into the drive coils can be substantially limited, but the width cannot be limited. Therefore, even slight deviations in the duty ratio of the input pulses will be accumulated in each of the cycles to produce great deviation in a case where the negative peak is even slightly smaller than the positive peak.

Figure 1:
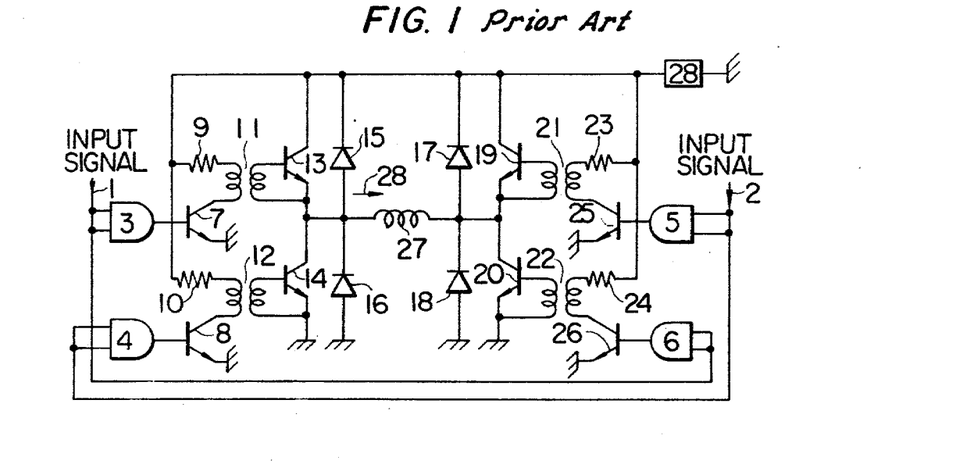
FIG. 1 is a diagram of a reference circuit cited to illustrate the defects inherent in the prior art.

FIG. 1 is a diagram showing a specific setup of a triangular wave drive circuit cited to comprehensively illustrate the defects of the above-mentioned prior art. The operation of the circuit shown in FIG. 1 will be described later with reference to a basic circuit shown in FIG. 4A. Here, the elements constituting the circuit of FIG. 1 are described in relation to the elements constituting the basic circuit of FIG. 4A, and the phenomenon of the level shift in the output current caused by the change in the duty ratio of the input pulses is illustrated.

Figures 3, 4A:
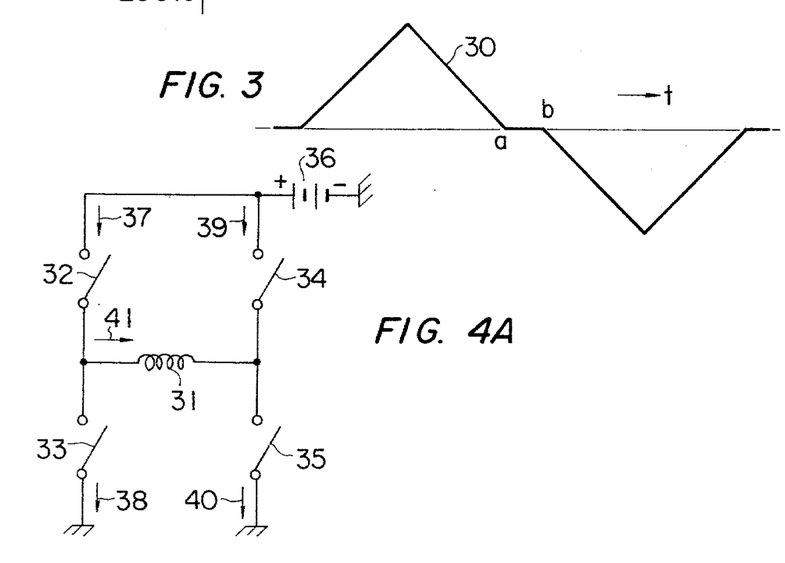
FIG. 3 is a diagram showing a drive current waveform according to the present invention.
FIG. 4A is a diagram showing the principle of a setup to illustrate the features of the drive circuit employed for the present invention.

Referring first to the actual components, a parallel circuit consisting of a transistor 13 and a diode 15 of FIG. 1 corresponds to a bi-directional switch 32 of FIG. 4A, a drive coil 27 of FIG. 1 corresponds to a drive roll 31 of FIG. 4A, a power source 28 of FIG. 1 corresponds to a direct-current voltage source 36 of FIG. 4A, and an input signal 1, AND gate circuit 3, transistor 7, resistor 9 and pulse transformer 11 of FIG. 1 correspond to a circuit (not shown) for controlling the opening and closing operation of the bi-directional switch 32 of FIG. 1A. Other relationships between FIG. 1 and FIG. 4A will be obvious from the above-mentioned relations.

Figure 2A:
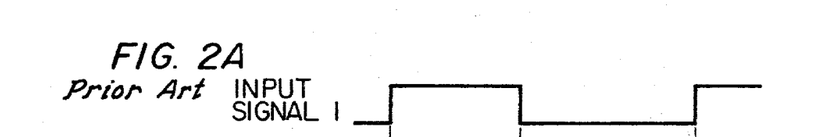
FIG. 2A to FIG. 2C are diagrams to illustrate the operation of the circuit of FIG. 1.
Figure 2B:
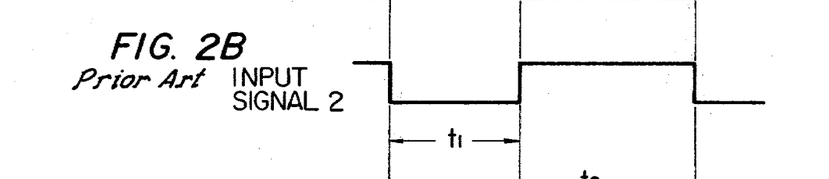

The phenomenon of level shift will now be discussed with reference to FIG. 2A to FIG. 2D. Pulses of input signals 1 and 2 of FIG. 1 are shown in FIG. 2A and FIG. 2B, respectively. Using the circuit of FIG. 1, an experiment was performed by changing the ratio of the pulse width $t_1$ of the signal 1 of FIG. 2A which renders the output transistors 13 and 20 conductive for one cycle $t_2$, i.e., by changing the duty cycle ratio d ($d = t_1/t_2 \times 100\%$).

Figure 2C:
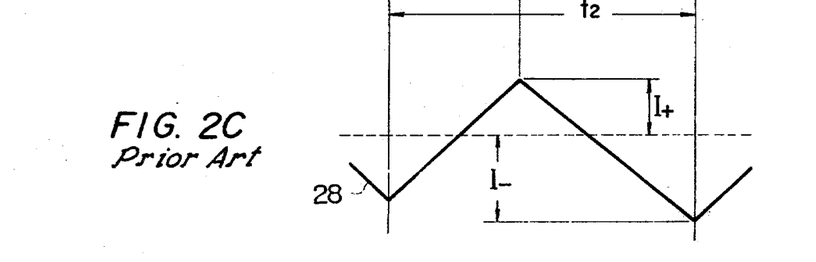

FIG. 2C shows the waveform of a current 28 flowing into the drive coil 27 of FIG. 1 owing to the turn on and off of the input signals 1 and 2 shown in FIGS. 2A and 2B.

Figure 2D:
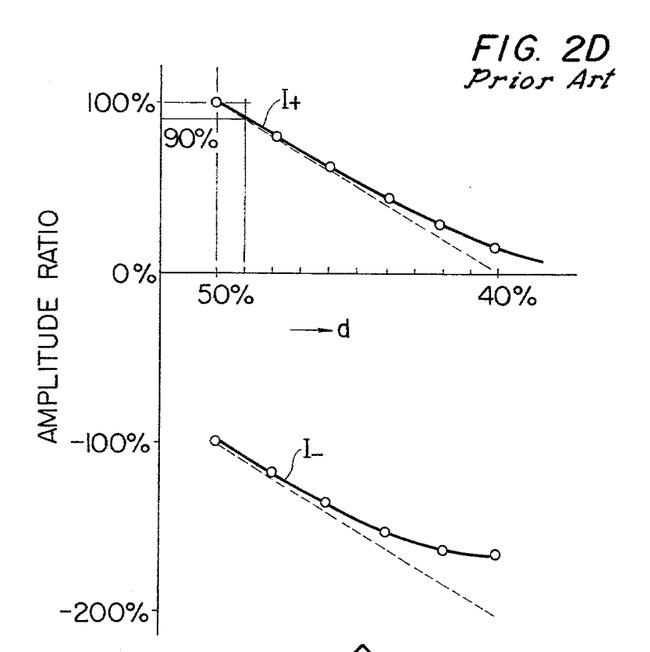
FIG. 2D shows a graph of current amplitude ratio against duty cycle ratio d.

FIG. 2D is a graph showing the change of peak current $I_+$ (refer to FIG. 2C) of positive polarity flowing into the drive coil 27 and the change of peak current $I_-$ (refer to FIG. 2C) of negative polarity depending upon the change of the duty cycle ratio d with respect to a current amplitude (100%) at the time of 50% of the duty cycle ratio. As will be obvious from FIG. 2D, the peak value is varied by as much as about 10% with a change of the duty cycle ratio d of about 1%. Therefore, in order to restrain the variation of peak value to be smaller than 1%, the variation of duty cycle ratio d must be restrained to be smaller than 0.1%. This is a value which cannot be easily accomplished with the conventional circuit systems.

As is well known, however, it is easy to start and stop the operation of the triangular wave drive circuit. Therefore, if the operation is reliably started and stopped for each half cycle, and if the operation of the subsequent half cycle is resumed after the energy in the drive coil has been reduced to zero, the aforementioned deviation will not be accumulated. That is, as represented by a current waveform 30 of FIG. 3, a horizontal step a-b (time region in which a time-differentiated value becomes zero) can be formed at a point at which the current crosses the time axis t with its amplitude being zero. In other words, with reference to FIG. 3, a starting point b of the negative waveform shall not be changed depending upon the terminating point a of the positive waveform. This means that when the current waveform 30 crosses the time axis t while its amplitude is zero, there exists a time region in which the time-differentiated value becomes zero. This can be effected by changing the timing of the input signal pulses as will be mentioned later with reference to an embodiment of the present invention.

Prior to illustrating the operation of the drive circuit of the present invention, certain features of the setup of the drive circuit employed for the present invention will be discussed. FIG. 4A shows a fundamental setup of the triangular wave drive circuit employed for the present invention. As will be obvious, the triangular wave drive circuit consists of the combination of three kinds of electrical elements, such as a direct-current voltage source (voltage E) 36, bi-directional switches 32, 33, 34 and 35, and a drive coil (inductance L) 31. Referring to the operation of the circuit, if the time axis is indicated in the form of phases, as is diagrammed in FIG. 4B to FIG. 4F, the bi-directional switches 32 and 35 are rendered conductive within the phase of 0° to 180°. This applies a d-c voltage E of positive polarity to the drive coil 31, and linearly increases a coil current (iL) 41 from a negative value to a positive value with an inclination given by $$E = L \cdot d(iL)/dt$$

Figures 4B, 4C, 4D, 4E:
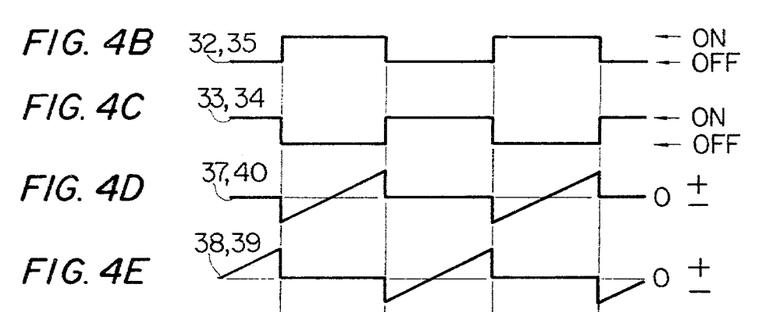
FIG. 4B to FIG. 4F are diagrams to illustrate the operation of the circuit shown in FIG. 4A.
Figure 4F:
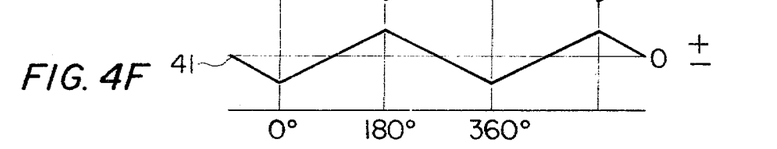

During this period, the electric current flows into the bi-directional switches 32 and 35 in the forms as designated at 37 and 40 in FIG. 4D. During a period in which the phase is between 180° to 360°, the bi-directional switches 32 and 35 are turned off, and the bi-directional switches 33 and 34 are rendered conductive so that a d-c voltage E of negative polarity is applied to the drive coil 31. The operation is quite the same as when the phase lies from 0° to 180°, except that the direction of the current is different. Therefore, an electric current of a triangular waveform flows into the coil 31 as designated at 41 in FIG. 4F. Here, attention should be given to the fact that currents 38 and 39 of negative polarity flow into the bi-directional switches 33 and 34 to electrically charge the power source 36 by means of the drive coil 31. Here, the electrical charge literally represents the charging of a battery if the power source 36 is a battery. If the power source is of the type utilizing a capacitor input having a rectification function, the electric charge will be the charging of a rectifier capacitor.

In any event, the charging current from the rectifier is reduced correspondingly.

Producing a current flow to the coil 31 serves to pour the energy from the power source 36 into the coil 31. According to the circuit of the present invention, the energy is not dissipated as heat, but is returned to the power supply 36. Accordingly, the drive circuit features very small power consumption.

Figure 5A:
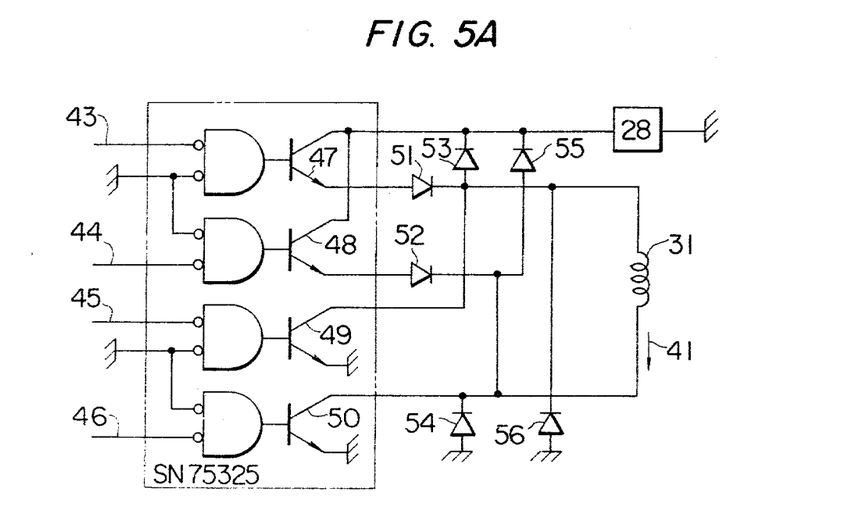
FIG. 5A is a diagram showing a specific setup of the drive circuit employed for the present invention.
Figure 5B:
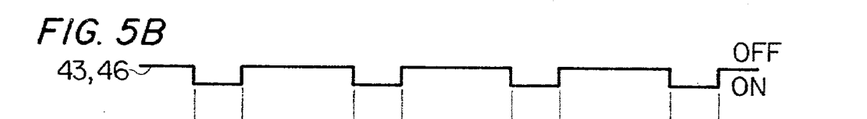
FIG. 5B to FIG. 5D are diagrams to illustrate the operation of the circuit shown in FIG. 5A.
Figure 5C:
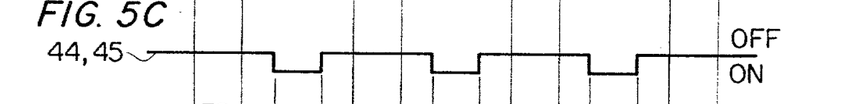
Figure 5D:
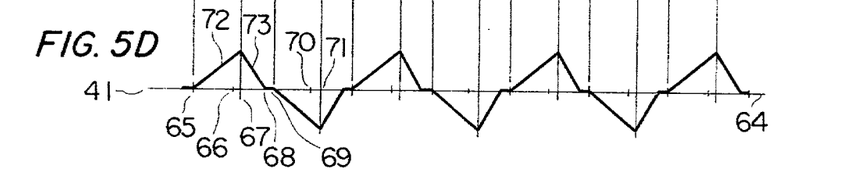

A circuit for driving the magnetic bubble device according to the present invention will now be discussed, referring to FIG. 5A, which shows a specific setup of the drive circuit according to the present invention. As will be obvious from FIG. 5A, the circuit setup of the present invention is similar to the fundamental setup shown in FIG. 4A. Namely, a significant feature of the present invention resides in the use of a conventional circuit setup in order to produce alternating current flows with a step to the drive coil by changing the conducting timings of the bi-directional switches. This operation of the drive circuit according to the present invention shown in FIG. 5A will be discussed in conjunction with FIG. 5B to FIG. 5D which show voltage and current waveforms.

Prior to starting the operation, the inputs 43 to 46 are all of a high level, and output transistors 47 to 50 are all in a cut-off state. When the inputs 43 and 46 are simultaneously changed to a low level at a time 65 on a time axis 64, the output transistors 47 and 50 are rendered conductive, and a coil current 41 linearly increases with an inclination as designated at 72. When the inputs 43 and 46 are simultaneously changed to the high level at a time 67, the output transistors 47 and 50 are rendered non-conductive, and the coil current 41 electrically charges a power source 28 via diodes 55 and 56. At this moment, the coil current 41 linearly decreases with an inclination 73 and reaches zero at a time 68.

Due to the nature of the coil, the inclination 72 is given by $$E_s - E_{sat}(47) - E_{sat}(50) = L(diL/dt)(72)$$

where $E_s$ represents a voltage of the d-c power source 28, $E_{sat}(47)$ and $E_{sat}(50)$ denote saturated collector-emitter voltages of the output transistors 47 and 50, L denotes an inductance of the coil 31, and iL denotes the coil current 41.

If values are set with $E_{sat}(47) = E_{sat}(50) = 0.5$ volt, $E_s = 10$ volts, and $L = 45$ μH, the inclination 72 is, $$diL/dt(72) = 0.2 \times 10^6 A/S.$$

The inclination 73 is given by $$E_s + E_d(55) + E_d(56) = L(diL/dt)(73)$$

since voltage drops $E_d(55)$ and $E_d(56)$ developed through the diodes 55 and 56, are added to the power source 28.

Thus, if the voltage drop is $E_d(55) = E_d(56) = 1$ volt, the inclination is $$diL/dt(73) = 0.27 \times 10^6 A/S.$$

That is to say, the inclination 73 is more steep than the inclination 72 by about 33%. This is caused by the fact that the voltage drop through the diodes or transistors acts toward the opposite direction depending upon whether the power source 28 serves as a source of energy or the coil 31 serves as a source of energy.

When there is no difference between the inclinations 72 and 73, the time 67 should be set to be equal to the time 66 at which the duty cycle is 25%, such that the time 68 is brought into agreement with the time 69 at which the duty cycle is 50%. When the driving frequency is 100 KHz (a period of 10 microseconds), if the time 67 is set to be equal to the time 66, a time gap of 0.83 microseconds develops between the time 68 and the time 69, causing the operation of the magnetic bubbles to become unstable. If the time 67 is deviated from the time 66 by 0.4 microseconds to become 2.9 microseconds, the time 68 becomes 4.84 microseconds, giving rise to the occurrence of a step (flat portion) in which the coil current 41 becomes zero for 0.16 microseconds between the time 68 and the time 69. This can be accomplished by controlling the timing of the input pulses through the AND gates coupled to the bases of transistors 47, 48, 49 and 50 in FIG. 5A to control the conduction periods of these transistors in the manner shown in FIG. 5D. With the time interval of such a duration, the step will not be extinguished even when affected by various factors (temperature, power supply, etc.), and the magnetic bubbles operate stably. Even when the width of the input pulses is varied by an amount of ±1% (25 nanoseconds), the amplitude is simply varied by an amount of ±1%. Thus, the variation is not accumulated for each of the cycles, and does not cause the current level to be greatly varied.

Figure 5E:
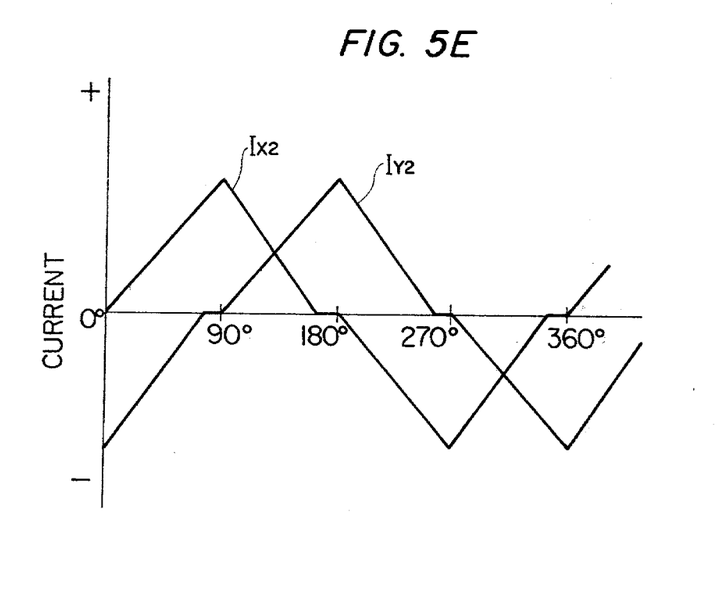
FIG. 5E to FIG. 5F are, respectively, a diagram showing current waveforms flowing into the drive coils X and Y, and a diagram showing locuses of the generated rotating magnetic fields.

FIG. 5E shows the waveforms of drive currents $I_{X2}$ and $I_{Y2}$ flowing into a pair of drive coils X and Y that are wound at right angles to each other in a situation where it is desired to use the present invention, as discussed above, to generate a rotating magnetic field. The drive current $I_{X2}$ for driving the coil X has a phase which is different by 90° from the phase of the drive current $I_{Y2}$ for driving the coil Y. The circuit arrangement for this could use a pair of circuits such as shown in FIG. 5A, wherein one of said pair drives the X coil, and the other of said pair drives the Y coil.

Figure 5F:
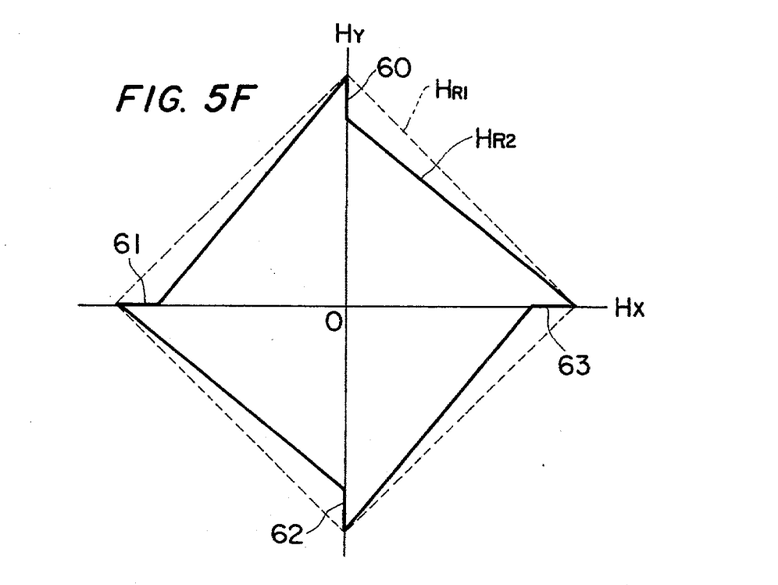

FIG. 5F is a graph showing the rotating magnetic field $H_R$ established on the plane of a magnetic bubble crystal by producing triangular wave drive current flows $I_X$ and $I_Y$ into the drive coils X and Y. In FIG. 5F, a rectangular graph $H_{R1}$ indicated by a broken line represents a conventional locus of a rotating magnetic field, i.e., a locus of a rotating magnetic field established by the triangular wave current shown in FIG. 4F, and a deformed rectangular graph $H_{R2}$ indicated by a solid line represents a locus of a rotating magnetic field produced by the present invention, i.e., a locus of rotating magnetic field established by the stepped triangular wave currents $I_{X2}$ and $I_{Y2}$ shown in FIG. 5E. The locus $H_{R2}$ has steps 60 to 63 due to the stepped triangular wave currents; however, the operation of the magnetic bubbles is not at all affected by the rotating magnetic field.

A second embodiment of the present invention will now be discussed. As mentioned earlier, one problem found in conventional triangular wave drive circuits is that the consumption of power is increased in high-frequency operation regions. In the following embodiment, the present invention is applied to a trapezoidal wave drive circuit to improve the above-mentioned defect. Such a trapezoidal wave drive circuit has been disclosed in John E. Ypma and Paul Swanson's "DESIGN AND PERFORMANCE OF A 100 K BYTE BUBBLE RECORDER" IEEE COMPCON, Spring 1977 Proc., February, 1977, pp. 239 to 242. Before discussing the application of the present invention to such a circuit, the trapezoidal wave drive circuit itself, and the conventional operation will be discussed.

Figure 6A:
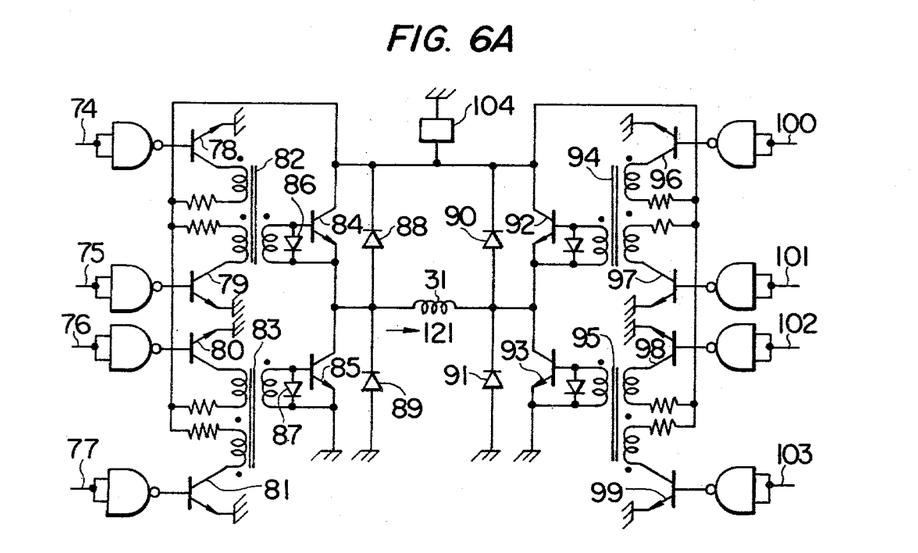
FIG. 6A is a diagram of a drive circuit which can be operated according to a second embodiment of the present invention.

FIG. 6A shows a specific setup of the trapezoidal wave drive circuit which is fundamentally constructed in the same manner as the circuit shown in FIG. 4A. That is, the bi-directional switches 32, 33, 34 and 35 shown in FIG. 4A correspond to the parallel circuits consisting of output transistors 84, 85, 92, 93 and diodes 88, 89, 90, 91 for returning the energy to a power source 104, shown in FIG. 6A.

The conventional operation of the circuit of FIG. 6A is illustrated below in conjunction with the time charts shown in FIGS. 6B to 6R. When the inputs 74, 77, 100 and 103 are at the low level, the drive transistors 78, 81, 96, and 99 are rendered conductive. Let it now be assumed that a coil current 121 is zero at a time 125 on the time axis t. If the inputs 75 and 102 are at their low level at this moment, the transistors 79 and 98 are rendered conductive, and the currents flow to the bases of the output transistors 84 and 93 to render them conductive. This allows application of voltage from the power source 104 to the coil 31 in the positive direction so that the positive coil current 121 flows in the coil 31. The coil current 121 increases nearly linearly. The input 75 acquires a high level at a time 105 just before (by about 200 nanoseconds) the time 126, and at the same time, the input 74 remains at the low level until the time 126 is reached. While the input 74 remains at the low level, the transistor 78 is rendered conductive whereby its output produces a current flow of a reverse direction to the base of the output transistor 84 through a pulse-transformer 82. This is to quicken the $t_{off}$ of the output transistor 84. In the triangular wave and trapezoidal wave drive circuits, the output transistors are switched from a maximum current to zero unlike that of the sine wave drive circuit. With the triangular and trapezoidal wave drive circuits, therefore, greater power is consumed during the switching operations, and it is necessary to minimize the $t_{off}$.

When the current of the output transistor 84 is cut off at the time 126, the current is caused to flow to the diode 89 because the coil current 121 cannot be changed so quickly. At this moment, the output transistor 93 still remains conductive, so that the coil current 121 flows through a loop consisting of coil 31→transistor 93→ground→diode 89→coil 31. This current is produced by the energy stored in the coil. Therefore, if the total loss resistance of the loop is denoted by r and the inductance of the coil by L, the current is slightly decreased according to a time constant L/r. When the output transistor 93 is cut off at the time 127, the coil current 121 flows into the diode 90. At this moment, a voltage toward the left direction is applied to the coil 31, and the inclination of the current is reversed. The current, therefore, is reduced nearly linearly. The output transistor 92 has been rendered conductive simultaneously with the cutoff of the transistor 93. Therefore, the coil current 121 which flows into the diode 90 and which becomes zero at a time 128, continues to linearly increase toward the negative direction. Thus, a trapezoidal wave current 121 flows into the coil 31 as shown in FIG. 6R.

Figure 6B:
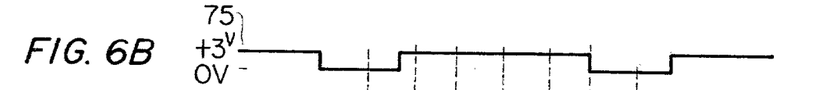
FIG. 6B to FIG. 6R are diagrams for illustrating the conventional operation of the circuit shown in FIG. 6A.
Figure 6C:
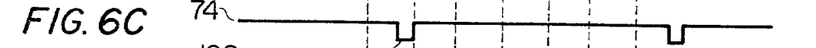
FIG. 6S is a diagram showing locuses of rotating magnetic fields generated by the conventional operations shown in FIGS. 6B to 6R.
Figure 6D:
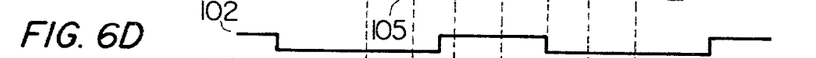
Figure 6E:
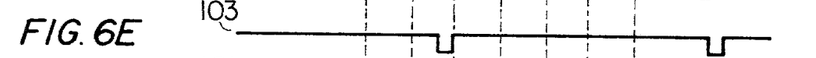
Figure 6F:
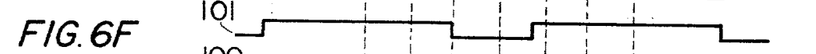
Figure 6G:
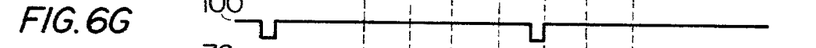
Figure 6H:
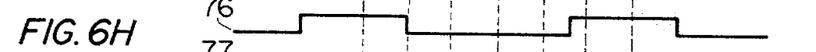
Figure 6I:
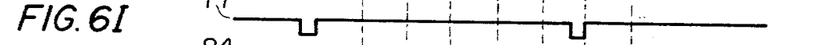
Figure 6J:
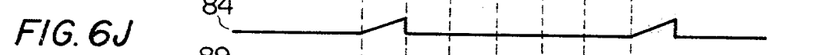
Figure 6K:
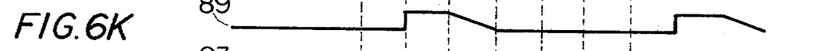
Figure 6L:
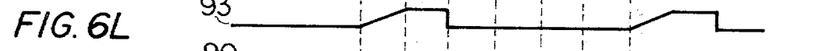
Figure 6M:
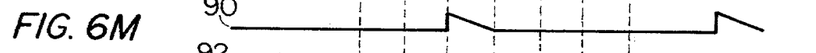
Figure 6N:
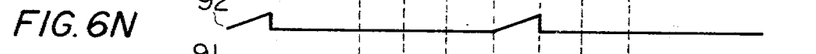
Figure 6O:
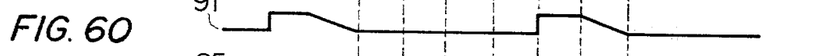
Figure 6P:
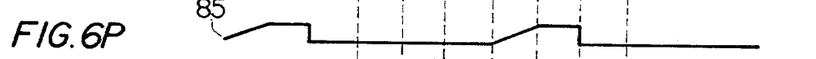
Figure 6Q:
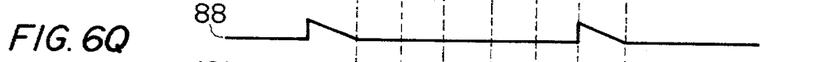
Figure 6R:
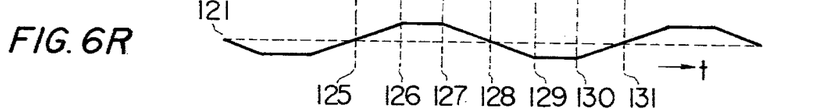
Figure 6S:
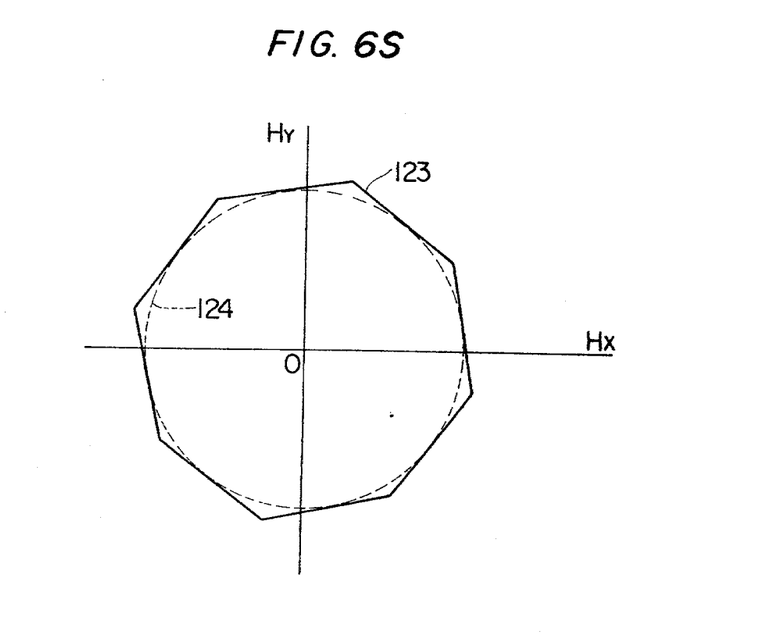

If trapezoidal wave currents generated as discussed above and having a phase difference of 90°, as shown in FIG. 6R, are caused to flow into a pair of drive coils X and Y that are wound at right angles to each other, a rotating magnetic field is generated in parallel with the surface of the magnetic bubble crystal placed amid the drive coils X and Y. The rotating magnetic field generated by the trapezoidal wave drive circuit describes an octagonal locus 123 as shown in FIG. 6S. The octagonal locus 123 shown in FIG. 6S is slightly deformed (tilted) as compared with the normal octagonal locus (not shown) due to voltage drops through the transistors and diodes, and the delay time of the circuit. For the purpose of reference, FIG. 6S shows a circle 124 drawn with a broken line to illustrate a locus of the rotating magnetic field established by a conventional sine wave drive circuit.

The locus 123 of the trapezoidal waves is close to a circle 124 as compared with the square locus of the triangular waves, and the power consumption of the drive circuit (including the coils but excluding the prestage) at a frequency of 200 KHz is increased by about 50% as compared with the operation at 100 KHz. This value is close to the increment of 15% in the case of the above-mentioned sine waves, and is significantly smaller than the increment of 100% in the case of the triangular waves. Also, the temperature rise in a one-chip package using the trapezoidal waves is comparable to that of the sine waves, i.e., an increase of about 10%, which is much smaller than the increase of 40% in the case of the triangular waves. Therefore, in effect, the octagonal locus by the trapezoidal wave drive is superior to the triangular wave drive in regard to the power consumption of the drive circuit and the generation of heat in the coils.

Figure 7:
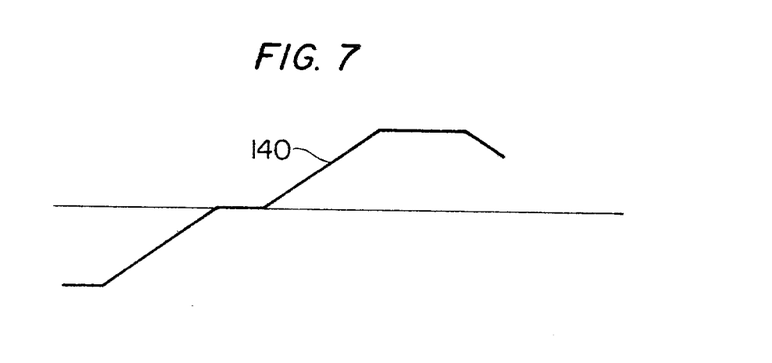
FIG. 7 is a diagram showing a current waveform according to the second embodiment of the present invention.

The above-mentioned comparisons of numerical values have dealt with a circular locus formed by the sine wave drive circuit, a rectangular locus formed by the triangular wave drive circuit circumscribing the circular locus, and an octagonal locus formed by the trapezoidal wave drive circuit circumscribing the circular locus. However, the operation of the trapezoidal wave drive circuit involves the same defect as mentioned with reference to the triangular wave drive circuit. Specifically, the level of the output current is shifted by the variation in width of the input pulses. The development of this phenomenon can be prevented by employing the stepped trapezoidal wave 140 (shown in FIG. 7) as mentioned earlier with reference to the embodiment of the triangular wave drive circuit.

Figures 8A, 8B, 8C, 8D, 8E:
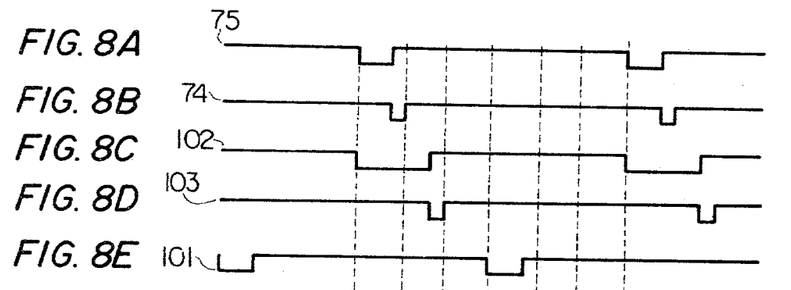
FIG. 8A to FIG. 8Q are time charts for operating the circuit of FIG. 6A in accordance with the present invention.
Figure 8F:
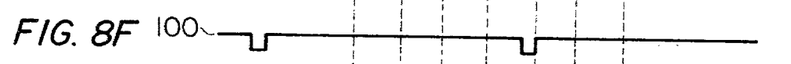
FIG. 8R to FIG. 8S are, respectively, a diagram showing current waveforms flowing into the drive coils X and Y according to the second embodiment of the present invention, and a diagram showing locuses of the generated rotating magnetic fields.
Figure 8G:
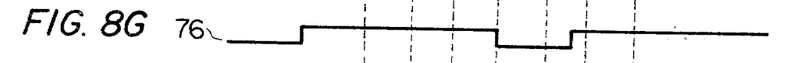
Figure 8H:
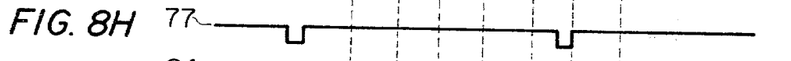
Figure 8I:
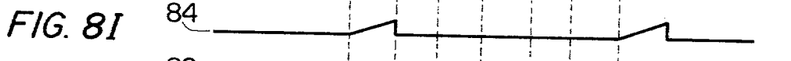
Figures 8J, 8K:
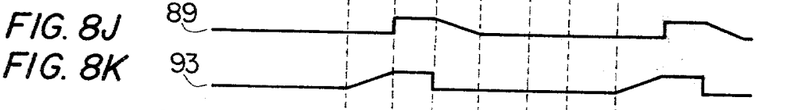
Figure 8L:
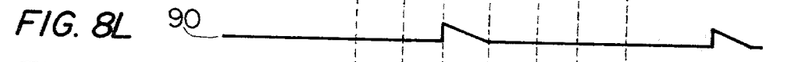
Figure 8M:
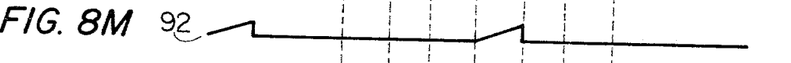
Figures 8N, 8O, 8P:
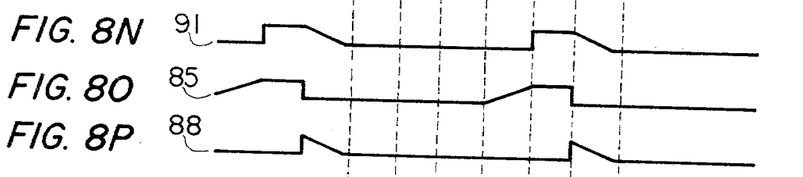
Figure 8Q:
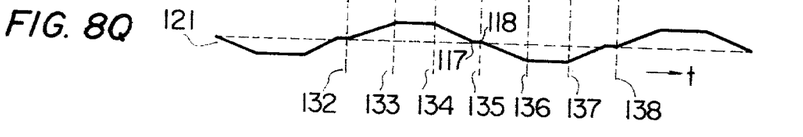

FIG. 8A to FIG. 8Q shows time charts for illustrating the operation of the stepped trapezoidal wave drive circuit. The stepped trapezoidal wave drive circuit is constructed in the same manner as the trapezoidal wave drive circuit shown in FIG. 6A. However, the operation is different, as discussed hereinafter.

The time charts of the stepped trapezoidal wave drive circuit shown in FIG. 8A to FIG. 8Q are different from the time charts of the trapezoidal wave drive circuit shown in FIG. 6B to FIG. 6R in regard to the inputs 75, 102, 101 and 76. As will be understood from the drawings, the inputs acquire the low level after the diode current has reached zero. Therefore, the coil current 121 becomes zero at the time 117, as shown in the drawings, and starts to increase from the time 118. Thus, it can be seen that this coil current 121 is slightly delayed.

Figure 8R:
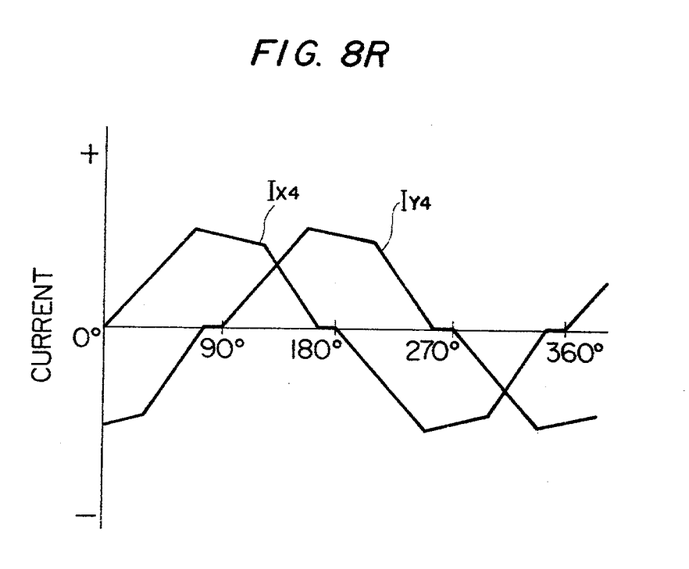
Figure 8S:
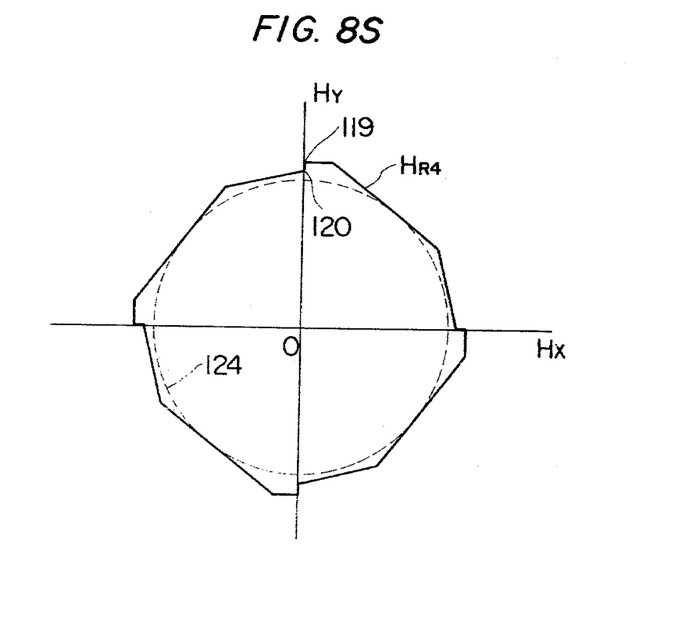

If the thus obtained stepped trapezoidal wave current 121 (shown in FIG. 8Q) is allowed to flow (as designated at $I_{X4}$, $I_{Y4}$ in FIG. 8R) to a pair of drive coils X and Y maintaining a phase as shown in FIG. 8R, a rotating magnetic field describing a deformed octagonal locus $H_{R4}$ can be obtained, as shown in FIG. 8S. The octagonal locus 123 shown in FIG. 6S is different from the octagonal locus $H_{R4}$ shown in FIG. 8S in regard to a step between a point 119 and a point 120 shown in FIG. 8S. This stems from the fact that while a flat portion in the coil current 121 of FIG. 8Q is slightly reduced according to a time constant L/r (L represents an inductance of the coil 31 and r represents a loss resistance of the coil 31), the other coil current becomes zero due to the stepped portions.

The above-mentioned steps in the octagonal locus, however, do not at all affect the operation of the magnetic bubbles.

As mentioned above, by employing a stepped trapezoidal wave current instead of a trapezoidal wave current, it is possible to prevent the level of the current from becoming shifted by the change in width of the input pulses thereby to provide distinguished effects.

According to the present invention as mentioned above, the change in the level of output current caused by a slight deviation of the timing pulses can be greatly reduced, and further, the trapezoidal wave drive which describes an octagonal locus makes it possible to construct a magnetic bubble device of a non-resonance drive type, which is only slightly different from the sine wave drive in regard to the power consumption by the drive circuit and the generation of heat by the coils.

Although the foregoing description has dealt with the case in which alternating currents having a phase difference of 90° are fed to two coils disposed at right angles to each other, the rotating magnetic field can be further established with alternating currents crossing at any angles, provided the phase difference is changed. Furthermore, the present invention can be constructed with the combination of three or more coils without being limited to the two coils disposed at right angles to each other.

Further, although the present invention was illustrated in the foregoing with reference to the cases of a triangular wave current and a trapezoidal wave current, the gist of the present invention is concerned with a magnetic bubble device of the type using a low-power-consumption non-resonant drive, in which the energy accumulated in the coils is not converted into the heat but is returned to the power source. Therefore, the waveform is not limited to a triangular wave or a trapezoidal wave only, but could be another waveform produced by a low-power-consumption, non-resonant drive circuit.

Moreover, although the embodiments have dealt only with the parallel connections of transistors and diodes to constitute bi-directional elements, any low-voltage-drop switching element can be used, provided it is capable of producing current flow in two directions. For instance, it is allowable to employ a bi-directional transistor (NPN transistor which is capable of producing a current flow from the emitter to the collector), a reversely connected switching circuit consisting of an ordinary one-way NPN transistor, or a switching circuit made up of an NPN transistor and a PNP transistor connected in parallel.

While we have shown and described several embodiments in accordance with the present invention, it is understood that the same is not limited thereto but is susceptible of numerous changes and modifications as known to a person skilled in the art, and we therefore to not wish to be limited to the details shown and described herein but intend to cover all such changes and modifications as are obvious to one of ordinary skill in the art.

We claim:

1. A drive circuit for a magnetic bubble device comprising:
    a parallel circuit comprising a first series circuit made up of a first bi-directional switch and a second bi-directional switch, and a second series circuit in parallel with said first series circuit and made up of a third bi-directional switch and a fourth bi-directional switch;
    a direct-current voltage source coupled to said parallel circuit to provide direct current voltage to each of said series circuits;
    one or more drive coils connected between a connection point of the first and second bi-directional switches of said first series circuit and a connection point of the third and fourth bi-directional switches of said second series circuit; and
    a switch control circuit for controlling the opening and closing operation of said first, second, third, and fourth bi-directional switches to produce an alternating current flow into said one or more drive coils;
    wherein said switch control circuit controls the opening and closing operation of said first, second, third, and fourth bi-directional switches so that the waveform of said alternating current has a time region of a predetermined length in which a time-differentiated value of said waveform is zero when the current going from the positive polarity to the negative polarity or going from the negative polarity to the positive polarity crosses a zero value on the time axis.

2. A drive circuit for a magnetic bubble device according to claim 1 wherein said switch control group controls the bi-directional switches to produce an alternating current of a triangular waveform.

3. A drive circuit for a magnetic bubble device according to claim 1 wherein said switch control group controls the bi-directional switches to produce an alternating current of a trapezoidal waveform.

4. A drive circuit for a magnetic bubble device according to claim 1 wherein said each of said bi-directional switches comprises a transistor and a diode coupled in parallel.

5. A drive circuit for a magnetic bubble device according to claim 1 wherein said first and second series circuits include means for feeding back current to said direct current voltage source to charge said direct current voltage source.

6. The drive circuit as claimed in claim 1 wherein said waveform of said alternating current has a time axis, and further comprising:
    means to further control the opening and closing of said first, second, third and fourth bi-directional switches to generate said waveform as a polygonal waveform of n sides above and n sides below said time axis, where n is an integer having a value of at least 4.

7. The drive circuit as claimed in claim 1 further comprising:
    means within said switch control circuit to generate a rotating magnetic field about a center of rotation, the locus of the magnitude of the magnetic field about said center of rotation describing a polygon of n sides where n is an integer having a value of at least 5.

8. A drive circuit for a magnetic bubble device according to claim 1, wherein said first and second series circuits feed back current to said direct current voltage source to charge said direct current voltage source.

9. A drive circuit for a magnetic bubble device comprising:

a parallel circuit comprising a first series circuit made up of a plurality of bi-directional switches and a second series circuit in parallel with said first series circuit and made up of a plurality of bi-directional switches;

a direct-current voltage source coupled to said parallel circuit to provide current voltage to each of said series circuits;

one or more drive coils connected between said first series circuit and said second series circuit; and a switch control circuit for controlling the opening and closing operation of said bi-directional switches to produce an alternating current flow into said one or more drive coils;

wherein said switch control circuit controls the opening and closing operation of said bi-directional switches so that the waveform of said alternating current has a time region of a predetermined length in which a time-differentiated value of said waveform is zero when the current going from the positive polarity to the negative polarity or going from the negative polarity to the positive polarity crosses a zero value on the time axis.

10. A method for driving a magnetic bubble device having:

a parallel circuit comprising a first series circuit made up of a plurality of bi-directional switches and a second series circuit in parallel with said first series circuit and made up of a plurality of bi-directional switches with a direct-current voltage source coupled to said parallel circuit to provide direct current voltage to each of said series circuits;

one or more drive coils connected between said first series circuit and said second series circuit; and a switch control circuit for controlling the opening and closing operation of said bi-directional switches to produce an alternating current flow into said one or more drive coils, wherein the method comprises:

controlling the opening and closing operation of said bi-directional switches so that the waveform of said alternating current has a time region of a predetermined length in which a time-differentiated value of said waveform is zero when the current going from the positive polarity to the negative polarity or going from the negative polarity to the positive polarity crosses a zero value on the time axis.

11. A method for driving a magnetic bubble device according to claim 10, wherein said switch control group controls the bi-directional switches to produce an alternating current of a triangular waveform.

12. A method for driving a magnetic bubble device according to claim 10, wherein said switch control group controls the bi-directional switches to produce an alternating current of a trapezoidal waveform.

13. The method of claim 10, wherein said waveform of said alternating current has a time axis, further comprising the step of:

further controlling the opening and closing of said bi-directional switches so that said waveform of said alternating current has a polygonal configuration of n sides above and n sides below said time axis, where n is an integer having a value of at least 4.

* * * * *